(12) United States Patent
Shibuya

(10) Patent No.: US 8,258,617 B2
(45) Date of Patent: Sep. 4, 2012

(54) SEMICONDUCTOR DEVICE, SEMICONDUCTOR PACKAGE, INTERPOSER, SEMICONDUCTOR DEVICE MANUFACTURING METHOD AND INTERPOSER MANUFACTURING METHOD

(75) Inventor: Koujirou Shibuya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/929,665

(22) Filed: Feb. 7, 2011

(65) Prior Publication Data

US 2011/0198760 A1  Aug. 18, 2011

(30) Foreign Application Priority Data

Feb. 15, 2010 (JP) ................... 2010-030438

(51) Int. Cl.
*H01L 23/52* (2006.01)
*H01L 23/48* (2006.01)

(52) U.S. Cl. ............ 257/692; 257/E23.02; 257/676; 257/698; 257/784; 438/126; 438/612

(58) Field of Classification Search .......... 257/E21.499, 257/E23.01, E23.02, 438, 676, 686, 690, 257/692, 698, 700, 762, 772, 774, 778, 784, 257/786, 697; 438/106, 108, 122, 126, 612; 174/257, 260, 261; 29/829
See application file for complete search history.

(56) References Cited

U.S. PATENT DOCUMENTS

| | | | | |
|---|---|---|---|---|
| 5,726,501 A * | 3/1998 | Matsubara | ............. | 257/778 |
| 6,118,180 A * | 9/2000 | Loo et al. | ............. | 257/737 |
| 6,396,707 B1 * | 5/2002 | Huang et al. | ............. | 361/760 |
| 6,469,393 B2 * | 10/2002 | Oya | ............. | 257/779 |
| 6,717,264 B2 * | 4/2004 | Ho et al. | ............. | 257/738 |
| 6,781,234 B2 * | 8/2004 | Hayashida | ............. | 257/738 |
| 6,791,178 B2 * | 9/2004 | Yamaguchi et al. | ......... | 257/699 |
| 6,924,987 B2 * | 8/2005 | Sugimoto et al. | ............. | 361/794 |
| 6,958,527 B2 * | 10/2005 | Hanaoka | ............. | 257/668 |
| 6,961,230 B2 * | 11/2005 | Otsuka et al. | ............. | 361/306.2 |
| 7,046,501 B2 * | 5/2006 | Tsuji | ............. | 361/306.2 |
| 7,053,315 B2 * | 5/2006 | Orui et al. | ............. | 174/267 |
| 7,098,540 B1 * | 8/2006 | Mohan et al. | ............. | 257/773 |
| 7,315,085 B2 * | 1/2008 | Liu | ............. | 257/773 |
| 7,347,348 B2 * | 3/2008 | Koopmans | ............. | 228/11 |
| 7,508,079 B2 * | 3/2009 | Higashi | ............. | 257/774 |
| 7,510,912 B2 * | 3/2009 | Caletka et al. | ............. | 438/122 |

(Continued)

FOREIGN PATENT DOCUMENTS

JP  10-313167  11/1998

(Continued)

*Primary Examiner* — Chris Chu
(74) *Attorney, Agent, or Firm* — McGinn IP Law Group, PLLC

(57) ABSTRACT

A technique which prevents cracking in a solder resist layer covering an interposer surface between external coupling terminals of an interconnection substrate, thereby reducing the possibility of interconnect wire disconnection resulting from such cracking. A semiconductor package is mounted over an interconnection substrate. An underfill resin layer seals the space between the semiconductor package and the interconnection substrate. External coupling terminals, interconnect wires and a solder resist layer are formed over the surface of an interposer (constituent of the semiconductor package) where the semiconductor chip is not mounted. In an area where an interconnect wire passing between two neighboring ones of the external coupling terminals intersects with a line connecting the centers of the two external coupling terminals, the interconnect wire is not covered by the solder resist layer.

9 Claims, 8 Drawing Sheets

U.S. PATENT DOCUMENTS

| | | | | |
|---|---|---|---|---|
| 7,622,377 | B2 * | 11/2009 | Lee et al. | 438/612 |
| 7,755,203 | B2 * | 7/2010 | Nishimura et al. | 257/778 |
| 7,999,189 | B2 * | 8/2011 | Chen et al. | 174/257 |
| 8,063,846 | B2 * | 11/2011 | Imaoka et al. | 343/851 |
| 2001/0025723 | A1 * | 10/2001 | Kondo et al. | 174/260 |
| 2002/0111054 | A1 * | 8/2002 | Huang et al. | 439/83 |
| 2003/0234118 | A1 * | 12/2003 | Hsu et al. | 174/262 |
| 2004/0012930 | A1 * | 1/2004 | Grigg | 361/743 |
| 2004/0041393 | A1 * | 3/2004 | Lee | 283/100 |

FOREIGN PATENT DOCUMENTS

JP        2003-023243        1/2003

* cited by examiner

SEMICONDUCTOR DEVICE, SEMICONDUCTOR PACKAGE, INTERPOSER, SEMICONDUCTOR DEVICE MANUFACTURING METHOD AND INTERPOSER MANUFACTURING METHOD

CROSS-REFERENCE TO RELATED APPLICATION

The disclosure of Japanese Patent Application No. 2010-30438 filed on Feb. 15, 2010 including the specification, drawings and abstract is incorporated herein by reference in its entirety.

BACKGROUND

1. Field of the Invention

The present invention relates to a semiconductor device in which a semiconductor package with an interposer is mounted over an interconnection substrate, a semiconductor package, an interposer, a semiconductor device manufacturing method, and an interposer manufacturing method.

2. Description of Related Art

For example, BGA packages and LGA packages are semiconductor packages. Semiconductor packages are anticipated to provide high reliability, particularly long-term reliability such as temperature cyclicity. If the temperature of a semiconductor device in which a semiconductor package is mounted over a printed wiring board changes, thermal stress generated due to the difference in thermal expansion coefficient between the printed wiring board and semiconductor package may affect a solder ball and cause a crack in the joint of the solder ball and an external coupling terminal of the package substrate or printed wiring board, resulting in a disconnection. Among techniques of preventing such disconnection are the techniques disclosed in Japanese Unexamined Patent Publication No. Hei 10 (1998)-313167 and Japanese Unexamined Patent Publication No. 2003-023243.

These techniques use an NSMD structure in order to prevent solder balls from running on a solder resist layer. The techniques eliminate a notch which may cause cracking and also reduce the possibility that a molten solder ball spreads over a wire from an external coupling terminal and runs on the solder resist layer.

The technique described in Japanese Unexamined Patent Publication No. Hei 10 (1998)-313167 uses an NSMD structure to decrease the width of the exposed portion of an interconnect wire. The technique described in Japanese Unexamined Patent Publication No. 2003-023243 uses an NSMD structure in which the exposed portion of an interconnect wire is covered by a solder resist layer. These techniques are described as further reducing the possibility that thermal stress of a solder ball is directly applied to the interconnect wire and disconnection of the interconnect wire occurs.

SUMMARY

However, the present inventors have found that a difference in thermal expansion coefficient as mentioned above may cause cracking in a solder resist layer covering the surface of an interposer between external coupling terminals and such cracking may lead to a wire disconnection. The inventors have also found it difficult for the above two conventional techniques to prevent disconnection of an interconnect wire passing between external coupling terminals.

According to a first aspect of the present invention, there is provided a semiconductor package which includes a semiconductor chip and an interposer having the semiconductor chip mounted over one surface thereof and a plurality of external coupling terminals formed over the other surface. Here, the interposer includes an interconnect wire passing between two neighboring ones of the external coupling terminals formed over the other surface and a solder resist layer formed over the other surface. The interconnect wire is exposed in an area where the interconnect wire intersects with a line connecting centers of the two external coupling terminals.

A wire disconnection resulting from a solder resist crack often occurs in an interconnect wire passing between external coupling terminals because the width of the solder resist layer is small between the external coupling terminals. According to the present invention, in the interposer, in an area where an interconnect wire passing between external coupling terminals intersects with a line connecting the centers of neighboring external coupling terminals, the interconnect wire is not covered by the solder resist layer. Therefore, according to the invention, the possibility of a wire disconnection resulting from a solder resist crack is reduced.

According to a second aspect of the invention, there is provided an interposer which includes: a plurality of first external coupling terminals formed over one surface thereof; a plurality of second external coupling terminals formed over another surface; an interconnect wire passing between two neighboring ones of the second external coupling terminals formed over the other surface; and a solder resist layer formed over the other surface. Here, the interconnect wire is exposed in an area where the interconnect wire intersects with a line connecting the centers of the two external coupling terminals.

According to a third aspect of the invention, there is provided a semiconductor device which includes: an interconnection substrate; a semiconductor package mounted over the interconnection substrate; and an underfill resin layer filled between the interconnection substrate and the semiconductor package. The semiconductor package includes a semiconductor chip and an interposer having the semiconductor chip mounted over one surface thereof and a plurality of external coupling terminals formed over the other surface. The interposer includes: an interconnect wire passing between two neighboring ones of the external coupling terminals formed over the other surface; and a solder resist layer formed over the other surface. Here, the interconnect wire is not covered by the solder resist layer in an area where the interconnect wire intersects with a line connecting the centers of the two external coupling terminals.

According to a fourth aspect of the invention, there is provided a method for manufacturing an interposer which includes forming an interconnect wire over a base member, coating a solder resist layer over the base member, and selectively removing the solder resist layer by photographic exposure and development. At the process of removing the solder resist layer selectively, in an area where an interconnect wire passing between external coupling terminals in the base member intersects with a line connecting the centers of two neighboring ones of the external coupling terminals, the interconnect wire is exposed.

According to a fifth aspect of the invention, there is provided a method for manufacturing a semiconductor device which includes making a semiconductor package by mounting a semiconductor chip over an interposer, mounting the semiconductor package over an interconnection substrate, and filling an underfill resin layer between the semiconductor package and the interconnection substrate. Here, in the interposer, in an area where an interconnect wire passing between external coupling terminals intersects with a line connecting centers of two neighboring ones of the external coupling terminals, the interconnect wire is exposed.

According to the present invention, the possibility of disconnection of an interconnect wire passing between external coupling terminals in an interposer is reduced.

BRIEF DESCRIPTION OF THE DRAWINGS

FIGS. 3A to 3D are sectional views showing the method for manufacturing the interposer according to the first embodiment, in which FIG. 3A shows the process of making an interconnection pattern, FIG. 3B shows the process of making a solder resist layer, FIG. 3C shows the process of removing the solder resist layer selectively, and FIG. 3D shows the process of making coatings;

DETAILED DESCRIPTION OF THE PREFERRED EMBODIMENTS

Figure 1:
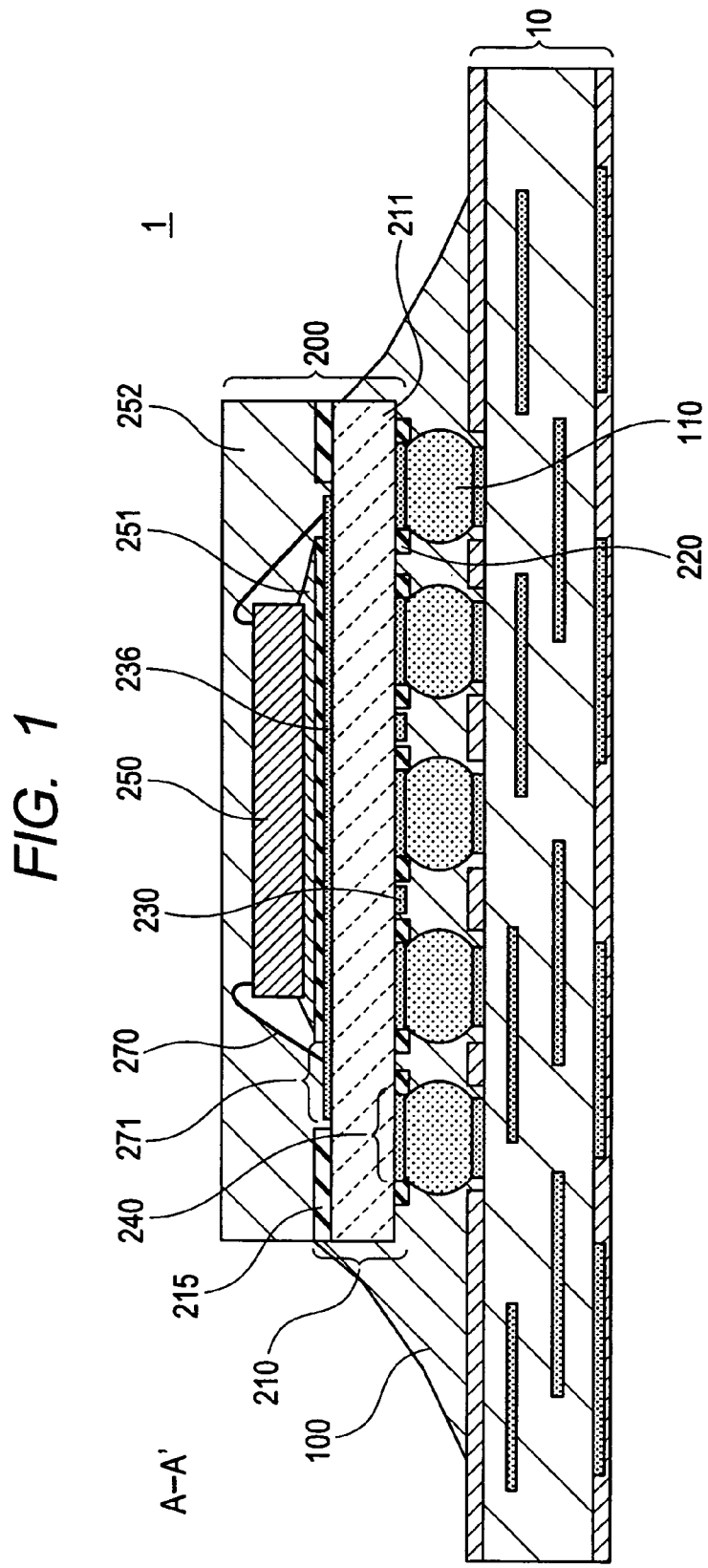
FIG. 1 is a sectional view showing the structure of a semiconductor device according to a first embodiment of the invention.

Next, the preferred embodiments of the present invention will be described in detail referring to the accompanying drawings. In all the drawings, the same elements are designated by the same reference numerals and repeated descriptions of such elements are omitted.

FIG. 1 is a sectional view showing the structure of a semiconductor device 1 according to a first embodiment of the invention. The semiconductor device 1 includes an interconnection substrate 10, a semiconductor package 200, and an underfill resin layer 100. The semiconductor package 200 includes a semiconductor chip 250 and an interposer 210. The interposer 210 has the semiconductor chip 250 mounted over one surface thereof and a plurality of external coupling terminals 240 and an interconnect wire 230 formed over the other surface and is covered by a solder resist layer 220. The semiconductor package 200 is mounted over the interconnection substrate 10, for example, through solder balls 110. The underfill resin layer 100 seals the space between the semiconductor package 200 and interconnection substrate 10. In an area where the interconnect wire 230 passing between two neighboring external coupling terminals 240 intersects with a line connecting the centers of the neighboring external coupling terminals 240, the interconnect wire 230 is not covered by the solder resist layer 220.

The semiconductor package 200 further includes a mount member 251 and a mold resin 252. The semiconductor chip 250 is mounted over the interposer 210 through the mount member 251 in a way that its active side is opposite to the interposer 210. Electrode pads (not shown) are formed on the active side of the semiconductor chip 250. These electrode pads are coupled to bonding pads 271 of the semiconductor package 200 by bonding wires 270. The mold resin 252 seals the semiconductor chip 250, the bonding wires 270 and the interposer 210's surface bearing the semiconductor chip 250.

Figure 2:
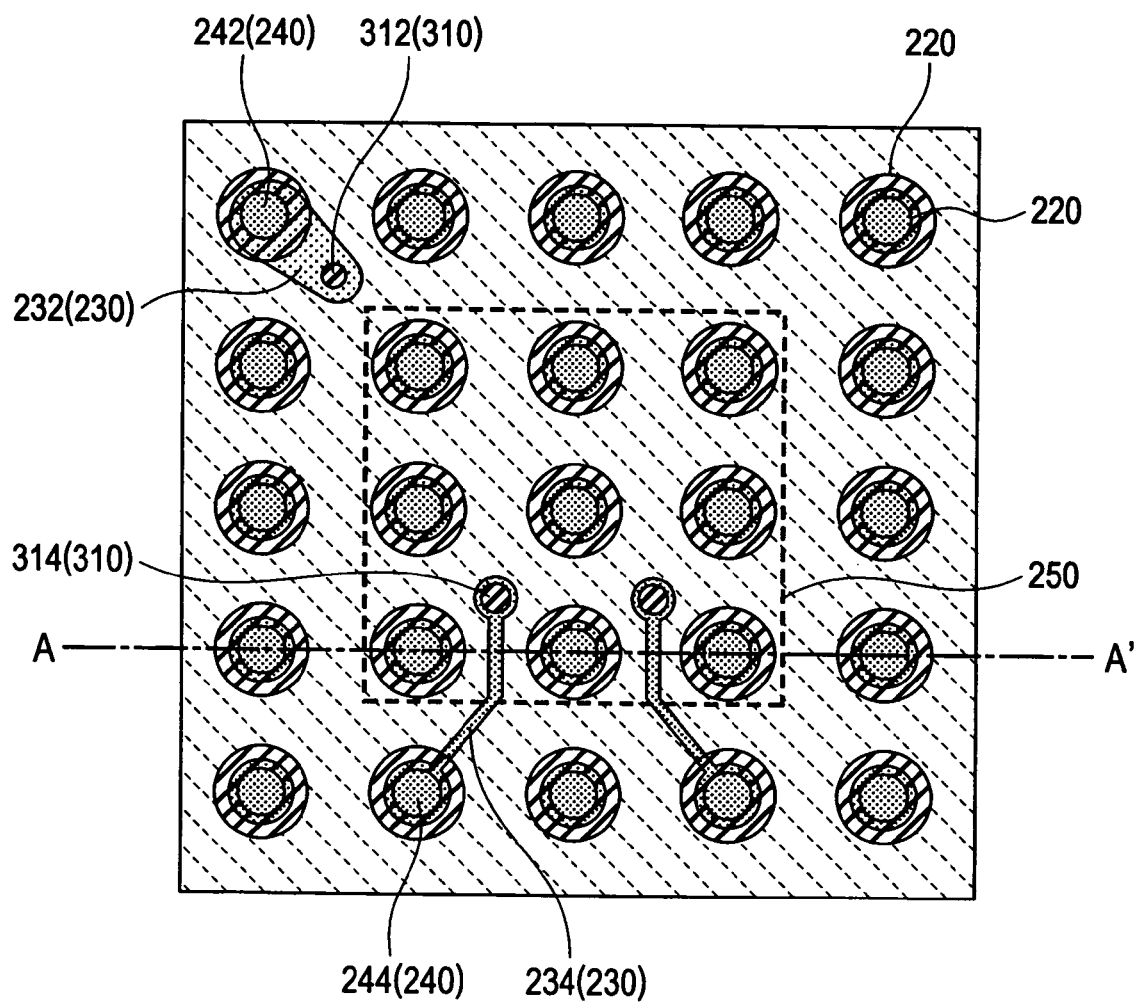
FIG. 2 is a plan view of a surface of an interposer according to the first embodiment before attachment of solder balls to the surface.

The interposer 210 includes a base member 211, a solder resist layer 215 and interconnect wire 236 which are formed on its surface to bear the semiconductor chip 250, and a solder resist layer 220 and interconnect wires 230 which are formed on its surface to be joined to the interconnection substrate 10. For example, the base member 211 is a glass epoxy board. The bonding pads 271 are provided on the interposer 210's surface to bear the semiconductor chip 250 and the external coupling terminals 240 and through holes 310 as shown in FIG. 2 are formed on its surface to be joined to the interconnection substrate 10. A conductor for coupling an interconnect wire 230 to the interconnect wire 236 is provided on the sidewall of each through hole 310. The through holes 310 are filled with the solder resist layer 220. For example, the underfill resin layer 100 is an epoxy resin layer. For example, the semiconductor package 200 is a BGA package like the one shown in FIG. 1.

FIG. 2 is a plan view of the interposer 210's surface to be joined to the interconnection substrate 10 before attachment of the solder balls 110 to the surface. FIG. 1 is a sectional view taken along the line A-A' of FIG. 2. The external coupling terminals 240 to which the solder balls 110 are attached are circular and two-dimensionally arranged, for example, in a grid pattern. A particular external coupling terminal 242 is coupled to a through hole 312 by an interconnect wire 232. A particular external coupling terminal 244 is coupled to a through hole 314 by an interconnect wire 234. The other external coupling terminals 240 are also coupled to through holes in the same way (not shown). The solder resist layer 220 has the shape of a ring and lies in the peripheral area of each external coupling terminal 240 and its vicinity. The solder resist layer 220 and external coupling terminal 240 are concentric with each other. The diameter of a solder resist opening 222 is smaller than that of an external coupling terminal 240. No solder resist layer 220 is formed over an interconnect wire 230 passing between external coupling terminals 240.

Figure 3A:
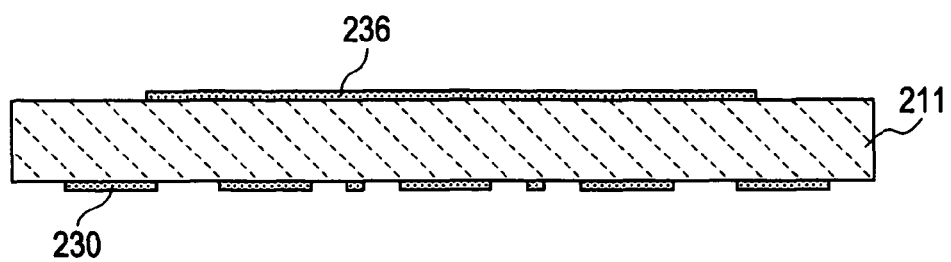
Figure 3B:
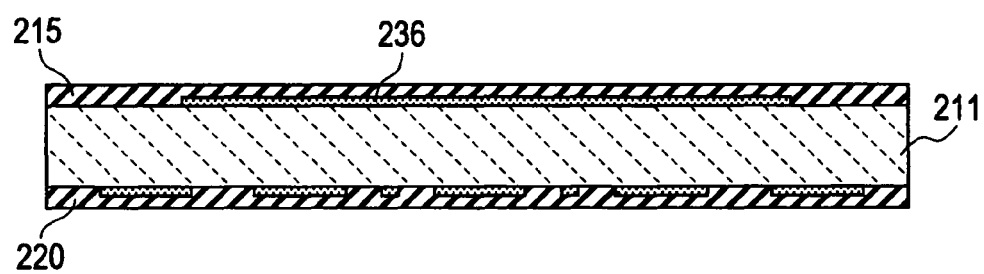
Figure 3C:
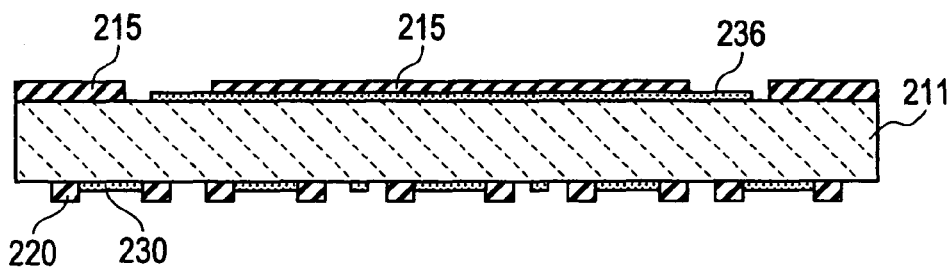
Figure 3D:
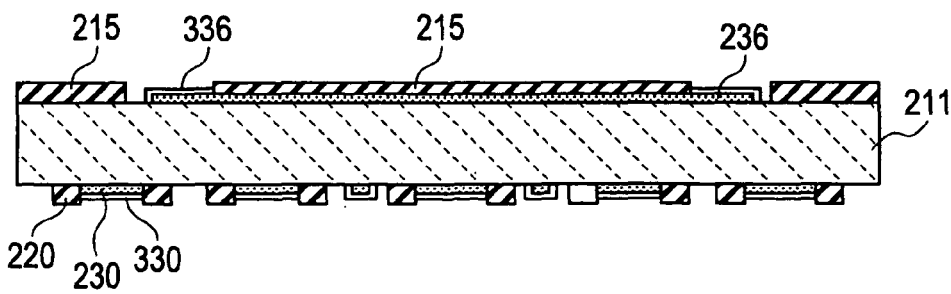

FIGS. 3A to 3D are sectional views showing the processes of manufacturing the interposer 210 shown in FIGS. 1 and 2. First, as shown in FIG. 3A, an interconnect wire 236 and interconnect wires 230 are formed on the front and back surfaces of the base member 211 respectively by patterning. Next, solder resist layers 215 and 220 are formed on the front and back surfaces respectively (FIG. 3B), then the solder resist layers 215 and 220 are selectively removed by photographic exposure and development processes to form a pattern as shown in FIG. 2 (FIG. 3C). Electrolytic Ni/Au coatings 330 and 336 are made over the exposed interconnect wires 230 and wire 236 using an electrolytic Ni/Au coating method (FIG. 3D). The interposer 210 is thus completed.

After that, the semiconductor chip 250 is mounted over the interposer 210 through the mount member 251. Then, the interposer 210 and semiconductor chip 250 are coupled to each other by the bonding wires 270. Then, the interposer 210, semiconductor chip 250, and bonding wires 270 are sealed with mold resin 252. The semiconductor package 200 is thus completed.

Figure 6:
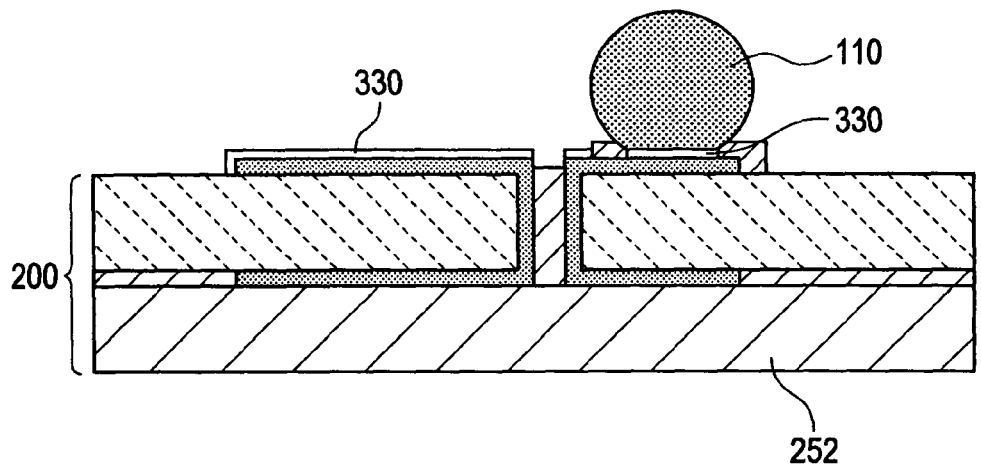
FIG. 6 is a sectional view showing the structure of a semiconductor package after a solder ball is attached.

After that, a solder ball 110 is attached to the semiconductor package 200 as shown in FIG. 6. The semiconductor package 200 and interconnection substrate 10 are joined through the solder balls 110. Then, the semiconductor package 200 is mounted over the interconnection substrate 10 and an underfill resin layer 100 is filled in the space between the semiconductor package 200 and interconnection substrate 10 to form the semiconductor device 1 as shown in FIG. 1.

Figure 7:
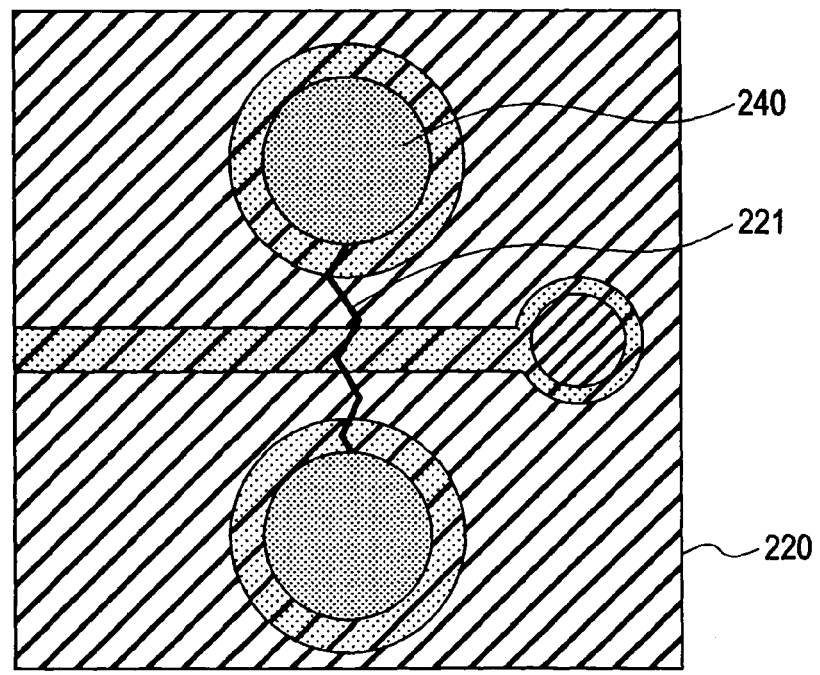
FIG. 7 is a plan view illustrating the problem to be solved by the present invention.

Next, the effect of this embodiment will be explained referring to FIGS. 1 and 7. In the semiconductor package 200 mounted over the interconnection substrate 10, a solder resist crack 221 may occur in the solder resist layer 220's area in contact with the underfill resin layer 100. It is thought that this occurs because thermal stress generated due to the difference in thermal expansion coefficient between the interconnection substrate 10 and semiconductor package 200 causes them to warp. As shown in FIG. 7, a solder resist crack 221 tends to occur in a narrow space between external coupling terminals 240 in the solder resist layer 220. Also, a solder resist crack 221 tends to occur in an area which overlaps the vicinity of an edge of the semiconductor chip 250 because expansion and contraction of the interposer 210 are restricted by the semiconductor chip 250.

In this embodiment, an interconnect wire 230 passing between external coupling terminals 240 is not covered by the solder resist layer 220. This means that a solder resist crack 221 never occurs on the interconnect wire 230. Therefore, disconnection of the interconnect wire 230 passing between the external coupling terminals 240 is prevented, thereby reducing the possibility of deterioration in the reliability of the semiconductor package 200.

Cracking hardly propagates inside the interposer 210 made of glass cloth impregnated with resin, so propagation of cracking into the interposer 210 is suppressed. Furthermore, the underfill resin layer 100 filled in the space between the semiconductor package 200 and interconnection substrate 10 prevents short-circuiting which can be caused by exposure of the interconnect wire 230.

Figure 4:
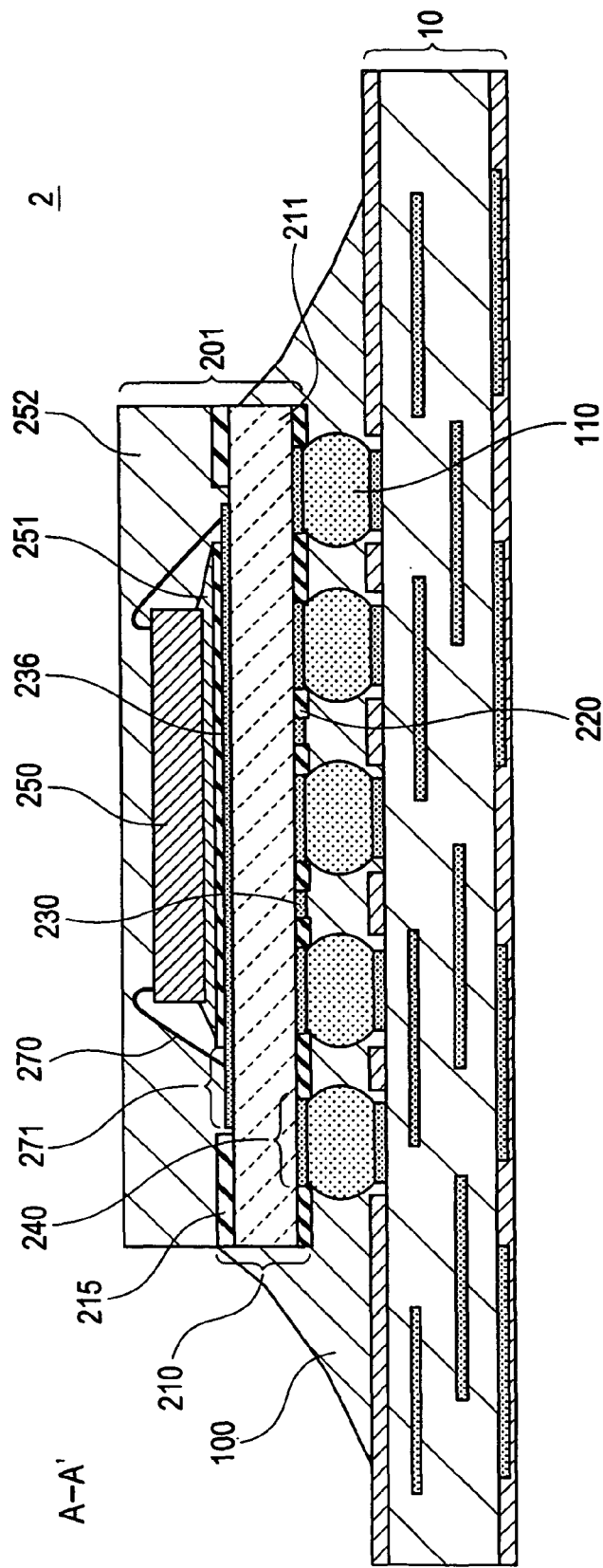
FIG. 4 is a sectional view showing the structure of a semiconductor device according to a second embodiment of the invention.
Figure 5:
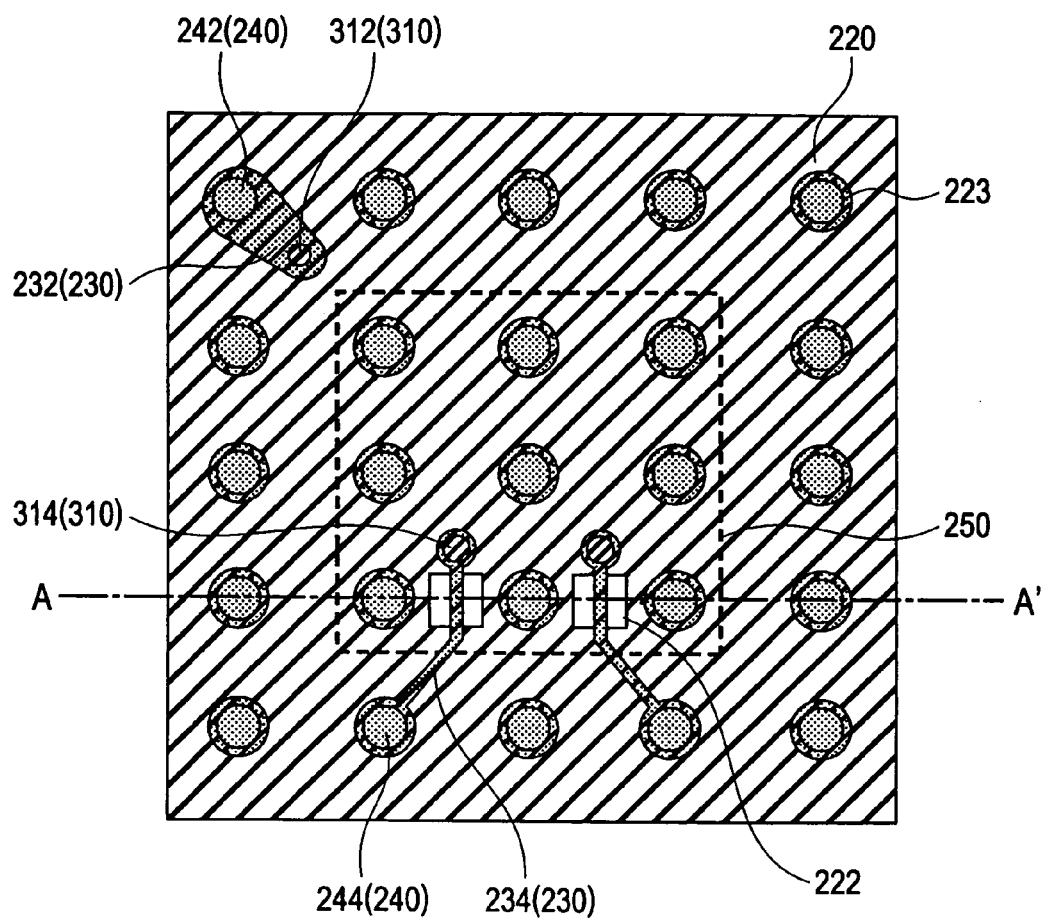
FIG. 5 is a plan view of a surface of an interposer according to the second embodiment before attachment of solder balls to the surface.

FIG. 4 is a sectional view showing the structure of a semiconductor device 2 according to a second embodiment of the invention, as a counterpart of FIG. 1 which shows the first embodiment. FIG. 5 is a plan view of the interposer 210's surface to be joined to the interconnection substrate 10 before attachment of the solder balls 110 to the surface in the semiconductor package 201 according to the second embodiment, as a counterpart of FIG. 2 which shows the first embodiment. FIG. 4 is a sectional view taken along the line A-A' of FIG. 5. The semiconductor device 2 and semiconductor package 201 according to the second embodiment are structurally the same as the semiconductor device 1 and semiconductor package 200 according to the first embodiment, except the pattern of the solder resist layer 220. The manufacturing method for the interposer 210 according to the second embodiment is the same as that for the interposer 210 according to the first embodiment.

As shown in FIG. 5, in the interposer 210 according to the second embodiment, a solder resist layer 220 is formed on the interposer 210's surface opposite to the interconnection substrate 10 except the areas of solder resist openings 223 over external coupling terminals 240 and solder resist openings 222. Each solder resist opening 223 lies over an external coupling terminal 240. Each solder resist opening 222 is formed over an interconnect wire 234 between external coupling terminals 240. Each interconnect wire 234 is passed between external coupling terminals 240 arranged along an edge of the semiconductor chip 250.

Since the semiconductor chip 250 restricts expansion and contraction of the interposer 210, a solder resist crack due to the difference in thermal expansion coefficient tends to occur in an area which overlaps the vicinity of an edge of the semiconductor chip 250. According to the second embodiment, a solder resist opening 222 is provided over an interconnect wire 230 passing between external coupling terminals 240 of the interposer 210, arranged along an edge of the semiconductor chip 250, and the solder resist layer 220 does not lie over the interconnect wire 230. Therefore, the same effect as in the first embodiment can be achieved in an area over each interconnect wire 230 passing between external coupling terminals 240 arranged along an edge of the semiconductor chip 250.

Furthermore, since the areas except the openings 222 and openings 223 are covered by the solder resist layer 220, the total area of electrolytic Ni/Au coatings 330 as shown in FIG. 3 is smaller than in the first embodiment. Consequently the semiconductor package manufacturing cost is lower. In addition, adhesion of foreign matter to interconnect wires is reduced during the semiconductor package manufacturing process.

Figure 8:
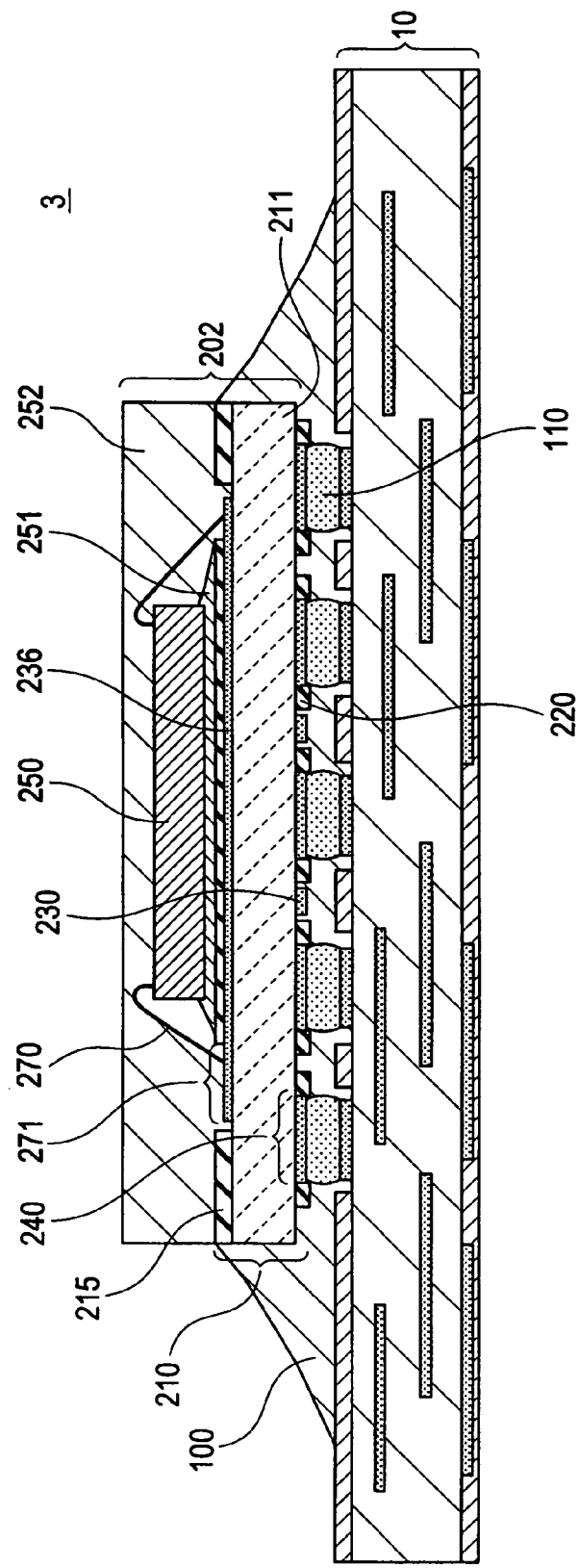
FIG. 8 is a sectional view showing the structure of a semiconductor device according to a third embodiment of the invention.

FIG. 8 is a sectional view showing the structure of a semiconductor device 3 according to a third embodiment of the invention, as a counterpart of FIG. 1 which shows the first embodiment. The semiconductor device 3 according to the third embodiment is structurally the same as the semiconductor device 1 according to the first embodiment, except that the semiconductor package 202 is an LGA package.

In the second embodiment as well, the solder resist layer 220 does not lie over an interconnect wire 230 passing between external coupling terminals 240 of the interposer 210, so the same effect as in the first embodiment can be achieved.

Figure 9:
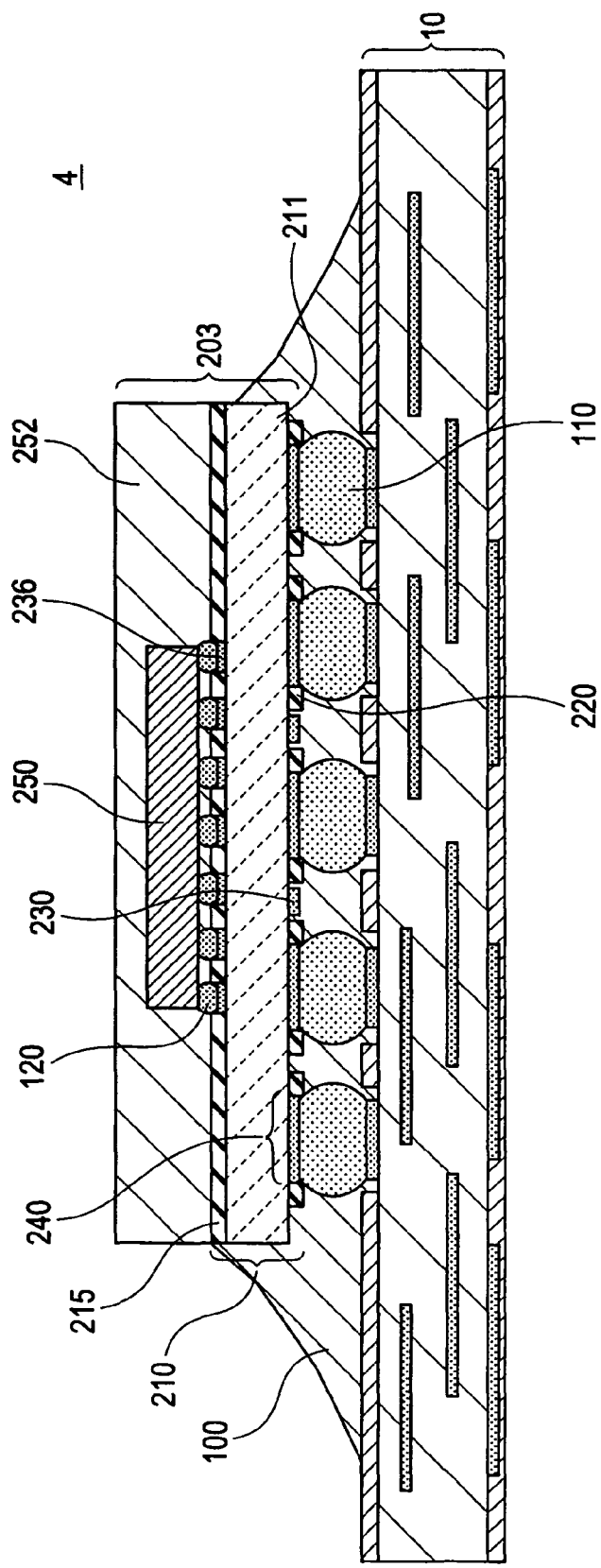
FIG. 9 is a sectional view showing the structure of a semiconductor device according to a fourth embodiment of the invention.

FIG. 9 is a sectional view showing the structure of a semiconductor device 4 according to a fourth embodiment of the invention, as a counterpart of FIG. 1 which shows the first embodiment. The semiconductor device 4 according to the fourth embodiment is structurally the same as the semiconductor device 1 according to the first embodiment, except that the semiconductor chip 250 is flip-chip coupled to the interposer 210 in the semiconductor package 203.

More specifically, the semiconductor chip 250 is mounted over the interposer 210 through bumps 120 with its active side facing the interposer 210. In the fourth embodiment as well, the solder resist layer 220 does not lie over an interconnect wire 230 passing between external coupling terminals 240 of the interposer 210, so the same effect as in the first embodiment can be achieved.

The preferred embodiments of the present invention have been so far described referring to the accompanying drawings. These embodiments are just illustrative of the invention. The invention can be embodied in other various forms.

What is claimed is:

1. A semiconductor package comprising:
a semiconductor chip; and
an interposer having the semiconductor chip mounted over one surface thereof and a plurality of external coupling terminals formed over another surface,
the interposer including:
an interconnect wire passing between two neighboring ones of the external coupling terminals formed over the other surface; and
a solder resist layer formed over the other surface,
wherein the interconnect wire is exposed in an area where the interconnect wire intersects with a line connecting centers of the two external coupling terminals.

2. The semiconductor package according to claim 1, wherein the two external coupling terminals are formed along an edge of the semiconductor chip.

3. The semiconductor package according to claim 1, wherein the solder resist layer is formed only in peripheral areas of the external coupling terminals and their vicinities.

4. The semiconductor package according to claim 1, wherein the solder resist layer has an opening in the area where the interconnect wire intersects with the line.

5. The semiconductor package according to claim 4, wherein the opening is symmetric with respect to the line.

6. An interposer comprising:
  a plurality of first external coupling terminals formed over one surface thereof;
  a plurality of second external coupling terminals formed over another surface;
  an interconnect wire passing between two neighboring ones of the second external coupling terminals formed over the other surface; and
  a solder resist layer formed over the other surface,
  wherein the interconnect wire is exposed in an area where the interconnect wire intersects with a line connecting centers of the two external coupling terminals.

7. A semiconductor device comprising:
  an interconnection substrate;
  a semiconductor package mounted over the interconnection substrate; and
  an underfill resin layer filled between the interconnection substrate and the semiconductor package,
  the semiconductor package including:
  a semiconductor chip; and
  an interposer having the semiconductor chip mounted over one surface thereof and a plurality of external coupling terminals formed over another surface,
  the interposer including:
  an interconnect wire passing between two neighboring ones of the external coupling terminals formed over the other surface; and
  a solder resist layer formed over the other surface,
  wherein the interconnect wire is not covered by the solder resist layer in an area where the interconnect wire intersects with a line connecting centers of the two external coupling terminals.

8. A method for manufacturing an interposer, comprising:
  forming an interconnect wire over a base member;
  coating a solder resist layer over the base member; and
  selectively removing the solder resist layer by photographic exposure and development,
  wherein at the process of removing the solder resist layer selectively, in an area where an interconnect wire passing between external coupling terminals in the base member intersects with a line connecting centers of two neighboring ones of the external coupling terminals, the interconnect wire is exposed.

9. A method for manufacturing a semiconductor device, comprising:
  making a semiconductor package by mounting a semiconductor chip over an interposer;
  mounting the semiconductor package over an interconnection substrate; and
  filling an underfill resin layer between the semiconductor package and the interconnection substrate,
  wherein in the interposer, in an area where an interconnect wire passing between external coupling terminals in the interposer intersects with a line connecting centers of two neighboring ones of the external coupling terminals, the interconnect wire is exposed.

* * * * *